United States Patent
Chaturvedi et al.

(10) Patent No.: US 9,869,725 B2
(45) Date of Patent: Jan. 16, 2018

(54) BATTERY SYSTEM AND METHOD WITH CAPACITY ESTIMATOR

(71) Applicant: Robert Bosch GmbH, Stuttgart (DE)

(72) Inventors: Nalin Chaturvedi, Sunnyvale, CA (US); Michael Schoenleber, Mountain View, CA (US); Jasim Ahmed, Mountain View, CA (US); Aleksandar Kojic, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 870 days.

(21) Appl. No.: 13/895,148

(22) Filed: May 15, 2013

(65) Prior Publication Data

US 2013/0311117 A1    Nov. 21, 2013

Related U.S. Application Data

(60) Provisional application No. 61/647,904, filed on May 16, 2012, provisional application No. 61/647,926, (Continued)

(51) Int. Cl.
  *G01R 31/36* (2006.01)
  *G06F 17/11* (2006.01)
  *H01M 10/44* (2006.01)

(52) U.S. Cl.
  CPC ..... *G01R 31/3637* (2013.01); *G01R 31/3606* (2013.01); *G01R 31/3624* (2013.01);
  (Continued)

(58) Field of Classification Search
  CPC .............................. G01R 31/3637; G06F 17/11
  See application file for complete search history.

(56) References Cited

U.S. PATENT DOCUMENTS

| | | | |
|---|---|---|---|
| 2012/0169284 A1* | 7/2012 | Park | H02J 7/045 320/112 |
| 2013/0006455 A1* | 1/2013 | Li | G01R 31/3651 701/22 |

(Continued)

FOREIGN PATENT DOCUMENTS

WO    2012009652 A2    1/2012

OTHER PUBLICATIONS

International Search Report and Written Opinion in corresponding PCT Application (i.e., PCT/US2013/041396), dated Sep. 18, 2013 (10 pages).

(Continued)

*Primary Examiner* — Paul D Lee
*Assistant Examiner* — Mark Crohn
(74) *Attorney, Agent, or Firm* — Maginot Moore & Beck LLP

(57) ABSTRACT

An electrochemical battery system in one embodiment includes at least one electrochemical cell, a current sensor configured to generate a current signal, a voltage sensor configured to generate a voltage signal, a memory in which command instructions are stored, and a processor configured to execute the command instructions to obtain the current signal and the voltage signal, and to generate an estimated cell nominal capacity ($C_{nom}$) of the at least one electrochemical cell by estimating a first leg $C_{nom}$ during a first charging sequence using a first charging current, estimating a second leg $C_{nom}$ during a second charging sequence using a second charging current, wherein the second charging current is at a current amplitude different from the current amplitude of the first charging current, and generating the cell $C_{nom}$ based upon the first leg $C_{nom}$ and the second leg $C_{nom}$.

6 Claims, 5 Drawing Sheets

Related U.S. Application Data filed on May 16, 2012, provisional application No. 61/647,948, filed on May 16, 2012.

(52) U.S. Cl.
CPC ..... *G01R 31/3651* (2013.01); *G01R 31/3662* (2013.01); *G06F 17/11* (2013.01); *H01M 10/446* (2013.01)

(56) References Cited

U.S. PATENT DOCUMENTS

2013/0300190 A1* 11/2013 Mao .................. G01R 31/3624
   307/9.1
2014/0350877 A1* 11/2014 Chow ................ G01R 31/3624
   702/63

OTHER PUBLICATIONS

Chaturvedi et al., "Algorithms for Advanced Battery-Management Systems," IEEE Control Systems Magazine, 2010, pp. 49-68, vol. 30, No. 3, U.S. (20 pages).

Dai et al., "Online SOC Estimation of High-power Lithium-ion Batteries used on HEV's," Vehicular Electronics and Safety, International Converence Vehicular Electronics and Safety, 2006, pp. 1-6, China P.R. (6 pages).

Lee et al., "Li-ion battery SOC estimation method based on the reduced order extended Kalman filtering," Journal of Power Sources, 2007, pp. 9-15, vol. 174, Republic of Korea (7 pages).

Piller et al., "Methods for state-of-charge determination and their applications," Journal of Power Sources, 2001, pp. 113-120, vol. 96, U.S. (8 pages).

Plett et al., "Extended Kalman filtering for battery management systems of LiPB-based HEV battery packs Part 3. State and parameter estimation," Journal of Power Sources, 2004, pp. 277-292, vol. 134, U.S. (16 pages).

Plett et al., "Sigma-point Kalman filtering for battery management systems of LiPB-based HEV battery packs Part 2: Simultaneous state and parameter estimation," Journal of Power Sources, 2006, pp. 1369-1384, vol. 161, U.S. (16 pages).

Roscher et al., "Dynamic electric behavior and open-circuit-voltage modeling of LiFePO4-based lithium ion secondary batteries," Journal of Power Sources, 2011, pp. 331-336, vol. 196, Germany (6 pages).

\* cited by examiner

BATTERY SYSTEM AND METHOD WITH CAPACITY ESTIMATOR

This application claims the benefit of U.S. Provisional Application No. 61/647,904 filed May 16, 2012, U.S. Provisional Application No. 61/647,926 filed May 16, 2012, and U.S. Provisional Application No. 61/647,948 filed May 16, 2012, the entirety of each of which is incorporated herein by reference. The principles of the present invention may be combined with features disclosed in those patent applications.

FIELD OF THE INVENTION

This invention relates to batteries and more particularly to electrochemical batteries.

BACKGROUND

Batteries are a useful source of stored energy that can be incorporated into a number of systems. Rechargeable lithium-ion (Li-ion) batteries are attractive energy storage systems for portable electronics and electric and hybrid-electric vehicles because of their high specific energy compared to other electrochemical energy storage devices. In particular, batteries with a form of lithium metal incorporated into the negative electrode afford exceptionally high specific energy (in Wh/kg) and energy density (in Wh/L) compared to batteries with conventional carbonaceous negative electrodes. Li-ion batteries also exhibit lack of hysteresis and low self-discharge currents. Accordingly, lithium-ion batteries are a promising option for incorporation into electric vehicles (EV), hybrid electric vehicles (HEV) and plug-in hybrid electric vehicles (PHEV).

One requirement for incorporation of batteries including Li-ion batteries into EV/HEV/PHEV systems is the ability to accurately compute the state of charge (SOC) and state of health (SOH) of the batteries in real time. SOC is a percentage which reflects the available energy in a cell compared to the available energy of the cell when fully charged. SOC is thus akin to the fuel gauge provided on fossil fuel based vehicles.

SOH is a general term which encompasses a variety of quantities and is in the form of a percentage which reflects the presently available energy and power in a cell assuming the cell to be fully charged compared to the available energy and power of the cell when fully charged at beginning of cell life. SOH is thus akin to the size of the fuel tank provided on fossil fuel based vehicles and the health of the engine to provide the power. Unlike the volume of a fuel tank and the power output of an engine, the SOH of a cell decreases over cell life as discussed more fully below.

Both SOC and SOH are needed to understand, for example, the available range of a vehicle using the cell and the available power. In order to provide SOH/SOC data, a battery management system (BMS) is incorporated into a vehicle to monitor battery parameters and predict SOH/SOC.

Various algorithms have been proposed for use in a BMS to maintain the battery system within safe operating parameters as well as to predict the actual available power in the battery system. One such approach based on an electrochemical paradigm is described by N. Chaturvedi, R. Klein, J. Christensen, J. Ahmed, and A. Kojic, "Algorithms for advanced battery-management systems," *IEEE Control Systems Magazine*, 30(3), pp. 49-68, 2010. Generally, in order to accurately estimate the SOH of a system, the SOC of the system must be accurately known. Conversely, in order to accurately estimate the SOC of a system, the SOH of the system must be accurately known.

SOC estimation, even when an accurate SOH is available, is challenging since simple methods of predicting SOC, such as Coulomb Integration, suffer from increased errors over increased integration time. The increased errors result from biased current measurements or discretization errors as reported by S. Piller, M Perrin, and A. Jossen, "Methods for state-of-charge determination and their applications," *Journal of Power Sources*, 96, pp. 113-120, 2001. Nonetheless, some approaches such as the approach described by U.S. Pat. No. 7,684,942 of Yun et al. use pure current integration to determine SOC and then derive SOH from the determined SOC.

Other approaches avoid exclusive reliance upon current integration by combining current integration with a form of SOC estimation to obtain an SOC as a weighted sum of both methods as disclosed in U.S. Pat. No. 7,352,156 of Ashizawa et al. In another approach reported by K. Ng, C. Moo, Y. Chen, and Y. Hsieh, "Enhanced coulomb counting method for estimating state-of-charge and state-of-health of lithium-ion batteries," *Journal of Applied Energy*, 86, pp. 1506-1511, 2009, the result obtained from current integration is reset in accordance with an OCV/SOC look-up table.

All of the foregoing approaches, however, rely upon obtaining a dependable initial value for the cell SOC. If a dependable initial value for cell SOC is not available, the described methods fail. Unreliable SOC values are commonly encountered during drive cycles or when switching off current. For example, during driving cycles or when switching off current, the dynamics of the battery may not decay to zero or settle at a steady-state level at the precise moment that a measurement is obtained. Thus a calculation depending upon an observed voltage may be biased if the voltage is obtained during a transient.

Other approaches such as those described in U.S. Patent Publication No. 2010/0076705 of Liu et al., U.S. Pat. No. 7,615,967 of Cho et al., and U.S. Patent Publication No. 2005/0231166 of Melichar work only in discrete special cases and are not guaranteed to work robustly during normal operation of a battery. These approaches may further incur increased errors as a battery ages with use.

Many advanced BMSs incorporate various forms of a Kalman filter such as those reported by H. Dai, Z. Sun, and X. Wei, "Online SOC Estimation of High-power Lithium-ion Batteries used on HEV's," *Vehicular Electronics and Safety*, ICVES, 2006, and J. Lee, O. Nam, and B. Cho, "Li-ion battery SOC estimation method based on the reduced order extended Kalman Filtering," *Journal of Power Sources*, 174, pp. 9-15, 2007. BMSs incorporating Kalman filters, however, are based upon an assumption of known and time-invariant parameters incorporated into a battery model. In a real battery system the various parameters vary on both a long-term and short-term basis. For example, battery aging alters the capacity and internal resistance of the battery over the long term. Thus, the SOH of the battery changes over cell lifetime introducing errors into SOC calculations. Moreover, temperature and rate of current draw vary over the short term and both temperature and rate of current draw affect the SOC determination. Accordingly, while accurate knowledge of the present SOH of the battery is a prerequisite for accurate SOC determination in approaches incorporating Kalman filters, such information may not be readily available.

Accurate estimation of SOH is likewise challenging. A good estimator has to be able to track battery model parameters on a short time scale to account for the parameters' dependence or rate of current draw, SOC, and temperature, and also on a long time scale to account for changing health of the battery. Estimators which operate when the battery is placed off-line have been proposed. Placing a battery offline in order to determine remaining driving range, however, is typically not possible. Moreover, this approach is not recursive resulting in increased computational expense. Thus, such off-line approaches are of limited value in providing near real-time estimation which is needed during operation of a vehicle.

Additionally, approaches which require stable input parameters, which may be available when a system is offline, cannot provide accurate estimates when presented with disturbances in the measured battery parameter signals like voltage and current noise, gain errors and/or measurement bias. Moreover, since the open circuit voltage (OCV) of most batteries is nonlinear, a direct application of standard parameter estimation theory which is directed to estimating a constant value is not possible. Accordingly, accurate knowledge of the present SOC of the battery is a prerequisite for accurate SOH determination. U.S. Pat. No. 7,352,156 of Ashizawa et al. addresses this issue by assuming a linearized model with an initially known OCV. As the actual SOC diverges from the assumed linear model, however, estimation errors are incurred and can eventually result in divergence of the estimator. Thus, known systems rely on the actual SOC or incorporate excess robustness into the SOH estimation to allow for SOC errors.

Accordingly, accurately estimating SOH and SOC presents a circular problem in known systems with accurate estimation of one parameter depending upon accurate foreknowledge of the other of the two parameters. Some attempts have been made to solve the circular problem by performing a combined estimation of both parameters. Such approaches have been reported by G. Plett, "Extended Kalman Filtering for battery management systems of LiPB-based HEV battery packs Part3. State and parameter estimation," *Journal of Power Sources*, 134, pp. 277-292, 2004, and M. Roscher and D. Sauer, "Dynamic electric behavior and open-circuit-voltage modeling of LiFePO4-based lithium ion secondary batteries," *Journal of Power Sources*, 196, pp. 331-336, 2011. These approaches, however, are computationally expensive.

An alternative approach to solving the circular SOH/SOC problem is to incorporate extended or unscented Kalman filters as reported by G. Plett, "Sigma-point Kalman Filtering for battery management systems of LiPB-based HEV battery packs. Part 2: Simultaneous state and parameter estimation," *Journal of Power sources*, 161, pp. 1369-1384, 2006. This approach, however, is also computationally expensive.

What is needed therefore is a battery system incorporating a BMS which can estimate the nominal capacity of a battery without prior knowledge of either battery SOC or SOH. A system which is much more robust than known approaches given initial inaccuracies such as unknown current sensor noise or bias would be beneficial. A system which accurately estimates nominal capacity of a battery without excessive computational cost would be further advantageous.

SUMMARY

An electrochemical battery system in one embodiment includes at least one electrochemical cell, a first sensor configured to generate a current signal indicative of an amplitude of a current passing into or out of the at least one electrochemical cell, a second sensor configured to generate a voltage signal indicative of a voltage across the at least one electrochemical cell, a memory in which command instructions are stored, and a processor configured to execute the command instructions to obtain the current signal and the voltage signal, and to generate an estimated cell nominal capacity ($C_{nom}$) of the at least one electrochemical cell by estimating a first leg $C_{nom}$ during a first charging sequence using a first charging current, estimating a second leg $C_{nom}$ during a second charging sequence using a second charging current, wherein the second charging current is at a current amplitude different from the current amplitude of the first charging current, and generating the cell $C_{nom}$ based upon the first leg $C_{nom}$ and the second leg $C_{nom}$.

In another embodiment, a method of generating an estimated cell nominal capacity ($C_{nom}$) of at least one electrochemical cell in a system includes estimating a first leg $C_{nom}$ during a first charging sequence using a first charging current ($u_1$), estimating a second leg $C_{nom}$ during a second charging sequence using a second charging current ($u_2$), wherein the $u_2$ is at a current amplitude different from the current amplitude of the $u_1$, and generating the cell $C_{nom}$ based upon the first leg $C_{nom}$ and the second leg $C_{nom}$.

DESCRIPTION

Figure 1:
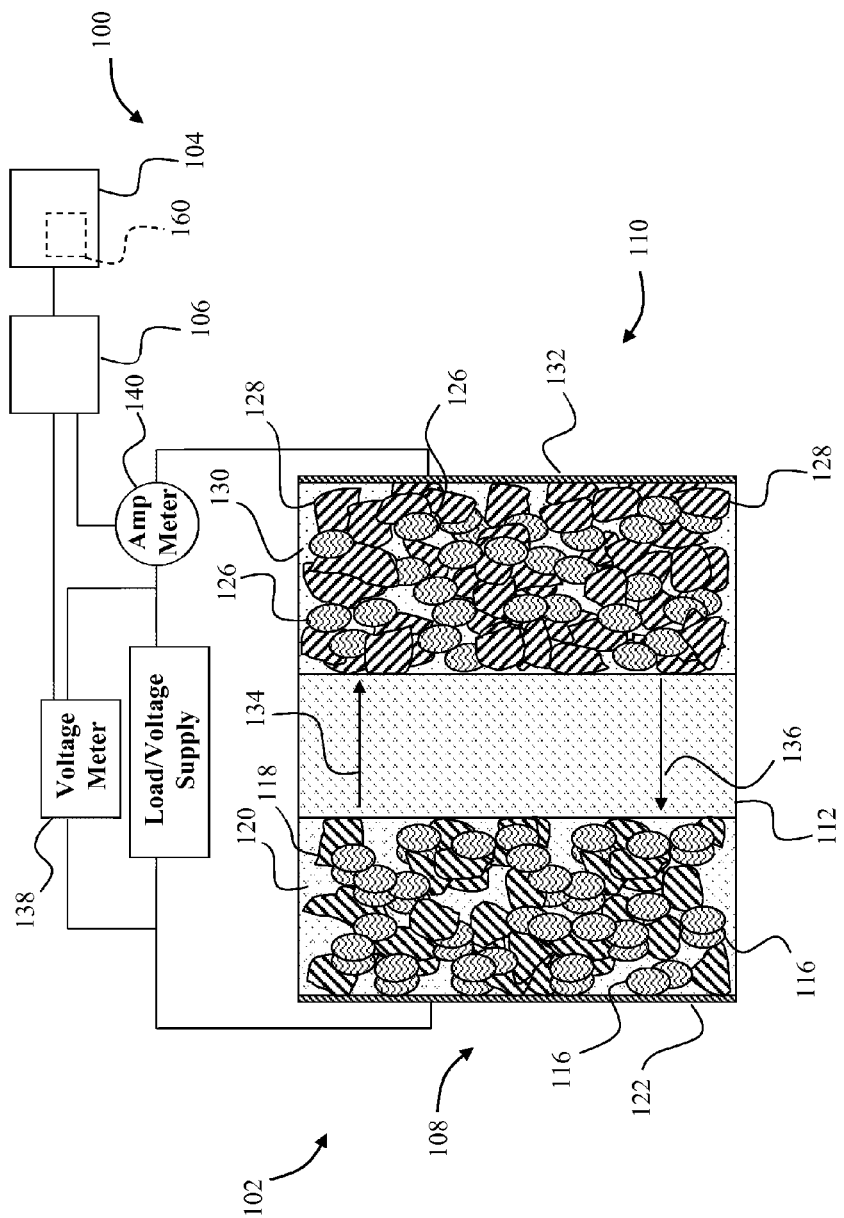
FIG. 1 depicts a schematic of a battery system including a lithium-ion cell, a processor, and a memory with command instructions which, when executed by the processor, run a parameter estimator which generates kinetic parameters of a model of the battery system and a reduced observer that estimates the SOC of the battery system.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

FIG. 1 depicts an electrochemical battery system 100 including an electrochemical cell in the form of Li-ion cell 102, a memory 104, and a processor 106. Various command instructions, discussed in further detail below, are programmed into the memory 104. The processor 106 is operable to execute the command instructions programmed into the memory 104.

The Li-ion cell 102 includes a negative electrode 108, a positive electrode 110, and a separator region 112 between the negative electrode 108 and the positive electrode 110. The negative electrode 108 includes active materials 116 into which lithium can be inserted, inert materials 118, electrolyte 120 and a current collector 122.

The negative electrode 108 may be provided in various alternative forms. The negative electrode 108 may incorporate dense Li metal or a conventional porous composite electrode (e.g., graphite particles mixed with binder). Incorporation of Li metal is desired since the Li metal affords a higher specific energy than graphite.

The separator region 112 includes an electrolyte with a lithium cation and serves as a physical and electrical barrier between the negative electrode 108 and the positive electrode 110 so that the electrodes are not electronically connected within the cell 102 while allowing transfer of lithium ions between the negative electrode 108 and the positive electrode 110.

The positive electrode 110 includes active material 126 into which lithium can be inserted, a conducting material 128, fluid 130, and a current collector 132. The active material 126 includes a form of sulfur and may be entirely sulfur. The conducting material 128 conducts both electrons and lithium ions and is well connected to the separator 112, the active material 126, and the collector 132. In alternative embodiments, separate material may be provided to provide the electrical and lithium ion conduction. The fluid 130, which may be a liquid or a gas, is relatively inert with respect to the other components of the positive electrode 110. Gas which may be used includes argon or nitrogen. The fluid 130 fills the interstitial spaces between the active material 126 and the conducting material 128.

The lithium-ion cell 102 operates in a manner similar to the lithium-ion battery cell disclosed in U.S. Pat. No. 7,726,975, which issued Jun. 1, 2010, the contents of which are herein incorporated in their entirety by reference. In other embodiments, other battery chemistries are used in the cell 102. In general, electrons are generated at the negative electrode 108 during discharging and an equal amount of electrons are consumed at the positive electrode 110 as lithium and electrons move in the direction of the arrow 134 of FIG. 1.

In the ideal discharging of the cell 102, the electrons are generated at the negative electrode 108 because there is extraction via oxidation of lithium ions from the active material 116 of the negative electrode 108, and the electrons are consumed at the positive electrode 110 because there is reduction of lithium ions into the active material 126 of the positive electrode 110. During discharging, the reactions are reversed, with lithium and electrons moving in the direction of the arrow 136. While only one cell 102 is shown in the system 100, the system 100 may include more than one cell 102.

Figure 2:
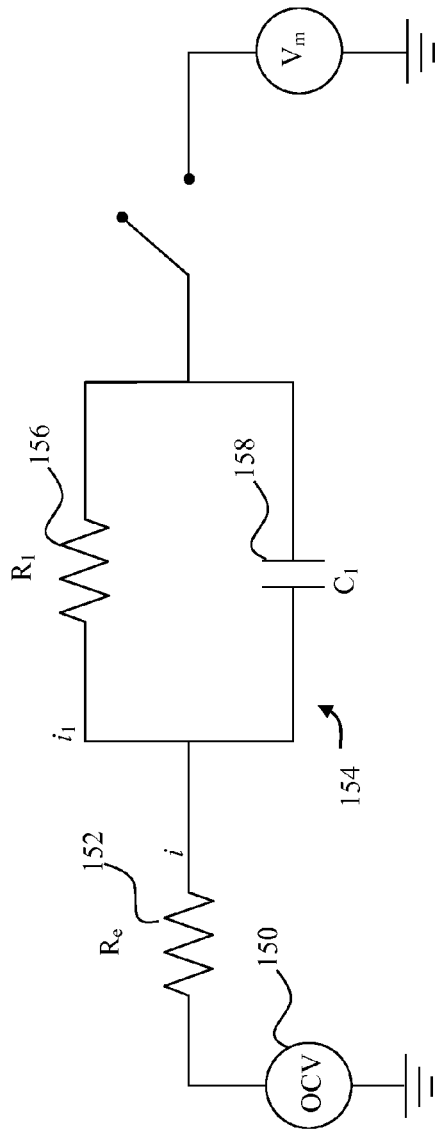
FIG. 2 depicts a schematic of an equivalent circuit of the battery system of FIG. 1 including static parameters (open cell voltage) and kinetic parameters, wherein the kinetic parameters include an effective resistance, and a parallel circuit in series with the effective resistance, the parallel circuit including a resistance in parallel with a capacitance.

During operation of the cell 102, cell voltage is monitored using a voltage meter 138 and an amp meter 140 monitors current flow into and out of the cell 102. Signals from the voltage meter 138 and the amp meter 140 are provided to the processor 106 which uses the signals to estimate the SOH and, in this embodiment, SOC of the cell 102. In general, the processor 106 uses a state space equation which models the cell 102 to estimate SOH and SOC. By way of background, a simple equivalent circuit for a known cell is depicted in FIG. 2. In FIG. 2, open cell voltage (OCV), nominal capacity ($C_{nom}$), rest voltage, etc., are modeled as static parameters 150. The internal resistance ($R_e$) 152 and a parallel circuit 154 including a resistor ($R_1$) 156 and a capacitor ($C_1$) 158 represent kinetic parameters.

State space equations for the equivalent circuit of FIG. 2 can be written, in continuous time, as the following:

$$\begin{pmatrix} \dot{x}_1 \\ \dot{x}_2 \end{pmatrix} = \begin{pmatrix} 0 & 0 \\ 0 & -1/(R_1 C_1) \end{pmatrix} \begin{pmatrix} x_1 \\ x_2 \end{pmatrix} + \begin{pmatrix} -1/C_{nom} \\ 1/R_1 C_1 \end{pmatrix} u,$$

and $$y = U_{OCV}(x_1) + (0 - R_1)\begin{pmatrix} x_1 \\ x_2 \end{pmatrix} + (-R_e)u,$$

wherein
"u" is the current applied to the battery,
"y" is the measured cell voltage,
"$x_1$" is the cell SOC,
"$x_2$" is the current ($i_1$) through the impedance ($R_1$) 156,
"$U_{OCV}$" is the open circuit voltage of the cell, and
"$C_{nom}$" is the nominal capacity of the cell associated with the $U_{OCV}$.

In the foregoing state equations, the SOH battery parameters $R_e$, $R_1$, and $C_1$, in general terms, are functions of the cell SOC, cell current, and cell temperature. Thus, the values for those parameters can vary over time (kinetic parameters). Consequently, the foregoing state equations are nonlinear. Moreover, since the second state space equation above incorporates the term "$U_{OCV}(.)$" as a function of $x_1$, it is inherently nonlinear, even in situations with otherwise constant parameters. Additionally, the first state space equation above reveals that the system dynamics are Lyapunov stable, not asymptotically stable. Accordingly, approaches which attempt to predict SOH or SOC using linear systems are inherently inaccurate.

Figure 3:
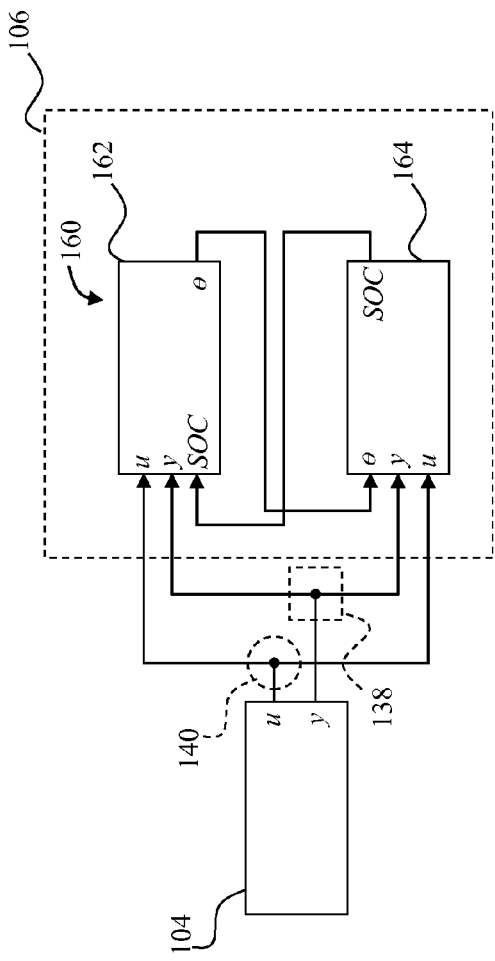
FIG. 3 depicts a schematic of a model executed by the processor of FIG. 1 including an estimator which generates the kinetic parameters of FIG. 2 and a reduced observer that generates an estimated SOC based upon a sensed voltage and sensed current of the battery system of FIG. 1.

In contrast with prior systems, the system 100 has a model 160 stored within the memory 104 which is executed by the processor 106 (see FIG. 1). The model 160 is schematically depicted in FIG. 3. The model 160 running within the processor 106 receives input from the voltage meter 138 and the amp meter 140. Signals indicative of the voltage of the cell 102 are provided to a parameter estimator 162 and, in this embodiment, a reduced modified observer 164. The parameters (Θ) estimated by the parameter estimator 162 are also provided as an input to the reduced modified observer 164 while the output (SOC) of the reduced modified observer 164 is provided as an input to the parameter estimator 162. The output parameters in this embodiment represent the values for the kinetic parameters $R_e$ 152, $R_1$ 156, and $C_1$ 158 of FIG. 2.

Simply incorporating an adaptive observer does not necessarily result in an algorithm which converges, however, because small initial errors in the SOC estimate provided to the parameter estimator can result in increasingly large SOH estimations. This problem may be exacerbated by unknown offsets in current and noise in current and voltage measurements.

In order to ensure convergence, the parameter estimator 162 estimates the kinetic parameters based upon voltage and current measurements of the cell 102 while applying a modified least squares algorithm with forgetting factor to data used in forming the estimation. In other words, while historical data are used in estimating present parameters, the older data are given exponentially less weight in the estimation.

Additionally, rather than directly using an OCV reading as an indication of SOC, the parameter estimator 162 uses a form of a derivative with respect to SOC of the OCV signal. Using a derivative of the OCV reduces the impact of an inaccurate SOC input since the OCV for the cell 102 exhibits a nearly constant slope over a wide range of SOC. Therefore, the impact of initial SOC errors on the accuracy of the estimation is reduced.

The algorithm for the parameter estimator 162 in one embodiment is derived from the above described state equations by defining a parametric form "$z$" in the following manner:

$$z = \frac{s^2 y}{\Lambda} + \frac{s\mathcal{L}\left\{U'_{OCV}(\hat{x}_1)\frac{u}{C_{nom}}\right\}}{\Lambda}$$

wherein "$\mathcal{L}(.)$" represents a Laplacé transform
"s" represents a complex number with real numbers σ and ω,
"$\Lambda$" represents a higher order filter with a cut-off frequency that depends upon the expected drive cycle (about 0.1 Hz in one embodiment), such as a $4^{th}$ order Butterworth filter with a cut-off frequency of 0.1 rad/s, and
"$\hat{x}_1$" is an estimate of the SOC from the observer 164.

Next, a vector ($\Phi$) is defined in the following manner:

$$\Phi = \begin{bmatrix} \Phi_1 \\ \Phi_2 \\ \Phi_3 \end{bmatrix} = \begin{bmatrix} \frac{su}{\Lambda} \\ \frac{s^2 u}{\Lambda} \\ \frac{sy}{\Lambda} + \frac{s\mathcal{L}\left\{U'_{OCV}(\hat{x}_1)\frac{u}{C_{nom}}\right\}}{\Lambda} \end{bmatrix}$$

Converting the foregoing into parametric form results in the following:

$$z = \Phi^T \Theta + \mathcal{C}(U_{OCV}(x_1(0)), t)$$

wherein
"$\Phi^T$" is a transpose of the matrix $\Phi$,
$\mathcal{C}: \mathbb{R} \times \mathbb{R}^+ \to \mathbb{R}$ is a class $\mathcal{K}\mathcal{L}$ function, $$\Theta = \begin{bmatrix} \Theta_1 \\ \Theta_2 \\ \Theta_3 \end{bmatrix}$$

$\in \mathbb{R}^3$ is a non-linear transformation of the physical parameters($R_e$, $R_1$, $C_1$) $\in \mathbb{R}^3$, and
the inverse transform is defined as:

$$\begin{bmatrix} R_e \\ R_1 \\ C_1 \end{bmatrix} = \begin{bmatrix} -\Theta_2 \\ \frac{\Theta_1 + \Theta_2 \Theta_3}{\Theta_3} \\ \frac{1}{\Theta_1 + \Theta_2 \Theta_3} \end{bmatrix}$$

In the equation above for the parametric form of "$z$", the last term accounts for effects resulting from an unknown state of charge. For an asymptotically stable filter design, however, the last two terms in the equation for the parametric form of "$z$" vanish asymptotically. Accordingly, by defining $\hat{\Theta}(t)$ to be an estimate of the parameters at time "t", the parameter estimator law is given by:

$$\dot{\hat{\Theta}}(t) = \epsilon(t) P(t) \Phi(t)$$

$$\epsilon(t) = z(t) - \Phi^T(t) \hat{\Theta}(t)$$

$$\dot{P}(t) = \beta P(t) - P(t)\Phi(t)\Phi(t)^T P(t)$$

wherein "$\epsilon$" is the output error,
"P" is a covariance matrix,
the matrix $P \in \mathbb{R}^{3\times 3}$ is initialized as a positive definitive matrix $P_o$, and
the initial parameters estimate $\hat{\Theta}(0) = \Theta_0$ is used as an initial value for the parameters ($\Theta$).

In the foregoing parameter algorithm, values for $C_{nom}$ and an estimate for the SOC ($\hat{x}_1$) are needed. The value of $C_{nom}$ is provided in this embodiment using an algorithm that provides a $C_{nom}$ without the need for SOC or SOH inputs as described more fully below. The SOC estimate and the $C_{nom}$ estimate is provided by the reduced observer 164.

Given the foregoing parameter estimator equations, the SOC for the cell 102 is defined by the following equation in the reduced observer 164:

$$\dot{\hat{x}}_1 = -\frac{u}{C_{nom}} + L\left(\frac{y}{\Lambda} - \frac{U_{OCV}(\hat{x}_1)}{\Lambda} + \frac{uR_e}{\Lambda} + \frac{sy}{\Lambda}R_1 C_1 + \frac{uR_1}{\Lambda} + \frac{su}{\Lambda}R_e R_1 C_1 + \frac{U'_{OCV}(\hat{x}_1)u}{\Lambda}\frac{R_1 C_1}{C_{nom}}\right)$$

wherein "L" is the gain of the reduced observer 164.

The reduced observer 164 thus converges to a residual set, i.e., a compact neighborhood of the desired values, for a bounded error estimate of SOH. The SOC estimate is fed into the SOH estimator 162 and modified parameters are generated by the estimator 162 and fed back to the reduced observer 164. Accordingly, the loop of FIG. 3 is closed.

In other embodiments, other observers are incorporated. By way of example, in one embodiment the SOC for the cell 102 is defined by the following equation in the reduced observer 164:

$$\dot{\hat{x}}_1 = -\frac{u}{C_{nom}} + L\left(\frac{y}{\Lambda} - \frac{\hat{y}}{\Lambda}\right)$$

wherein "u" is the current applied to the battery,
"$C_{nom}$" is the nominal capacity of the cell,
"L" is the gain of the reduced observer 164
"y" is the measured cell voltage,
"$\Lambda$" represents a higher order filter with a cut-off frequency that depends upon the expected drive cycle (about 0.1 Hz in one embodiment), such as a $4^{th}$ order Butterworth filter with a cut-off frequency of 0.1 rad/s, and
"$\hat{y}$" is the estimate of the output voltage.

As noted above, the model 160 includes an algorithm which allows $C_{nom}$ for the cell 102 to be estimated using the reduced observer 164. The model 160 to this end incorporates a reduced observer equation based on the following SOC equation:

$$\dot{x}_1 = -\frac{u + \delta u}{C_{nom}}$$

wherein "$\dot{x}_1$" is the estimated SOC,

"u" is the current associated with the cell 102, and

"δu" is the unknown constant offset associated with current measurement.

In solving for SOC, however, the model 160 in this embodiment does not rely upon a foreknowledge of the $C_{nom}$ or δu terms. Rather, the model 160 performs the $C_{nom}$ estimation during a period of charging wherein parameters are controlled so as to eliminate the $C_{nom}$ and δu terms. The SOC charging sequence is depicted in FIG. 4

Figure 4:
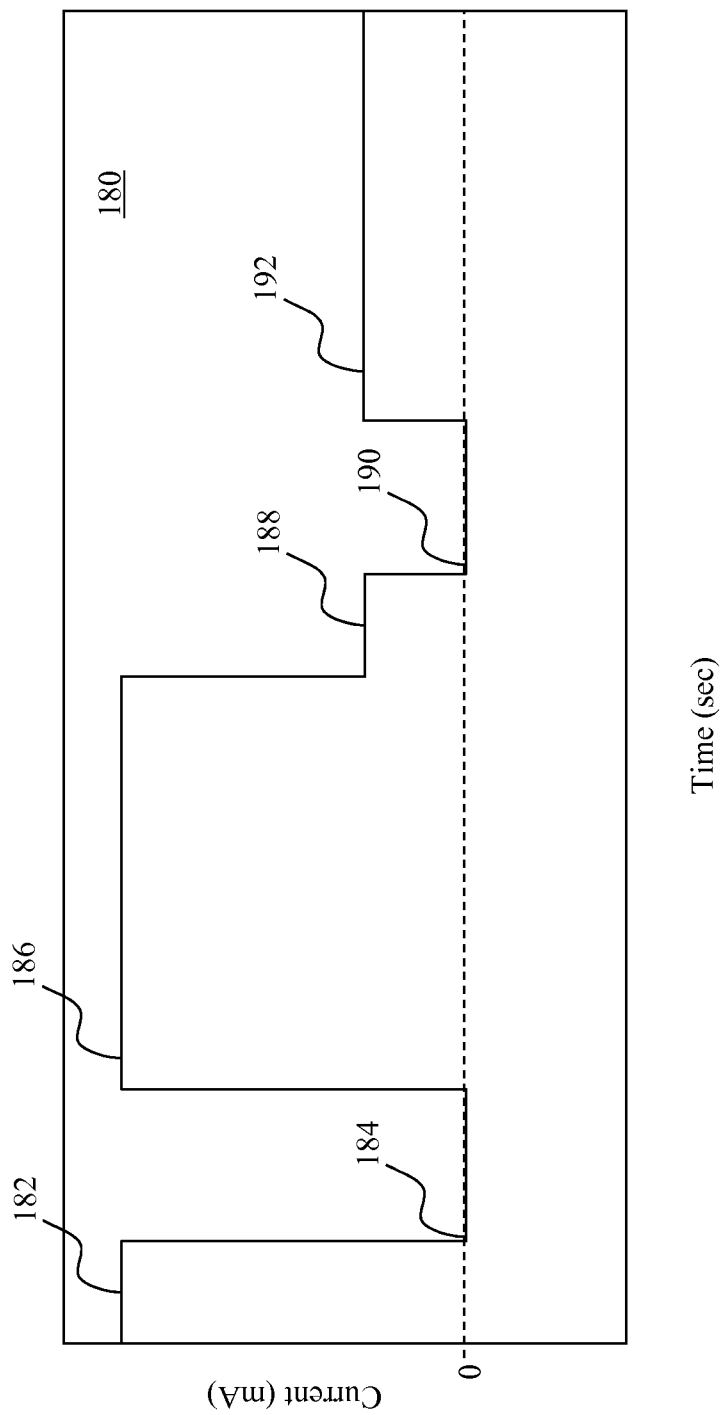
FIG. 4 depicts a charging sequence which can be used in embodiments which include a reduced observer to generate a $C_{nom}$ for the system.

FIG. 4 depicts a charging profile 180. The processor 106 may execute program instructions stored in the memory 104 to effect the charging profile 180. Initially, a first charge current ($u_{1-1}$) is applied to the cell 102 during an initial charging period 182. The first charge current $u_{1-1}$ is applied for a length of time which is sufficient to allow any dynamics resulting from the capacitance of $C_1$ 158 (see FIG. 2) to settle. A voltage reading is then obtained. The voltage value may be obtained using the voltage meter 138. Sufficiently accurate voltage readings may be obtained even in a noisy environment by incorporating a low pass filter with a high cut-off frequency into the voltage meter 138.

Once the voltage at the first charge current $u_{1-1}$ is obtained during the initial charge period 182, the charging current is removed for a rest period 184. Once the system has settled, the voltage is then obtained during the rest period 184. The difference between the voltage during application of the current $u_{1-1}$ and the voltage ($U_{OCV}$) during the rest period 184 is due to the applied current $u_{1-1}$ plus whatever unknown constant offset δu is present in the current detector 140. The over-potential loss compared to the $U_{ocv}$ is represented by the following equation:

$$\Delta y_1 = R_{eff}(u_1 + \delta u)$$

wherein $R_{eff}$ is the effective impedance of the cell 102.

Once the $\Delta y_1$ has been obtained, the following equations are run:

$$\dot{\hat{x}}_1 = -\frac{u_{1-1}}{C_{nom,E}} + L(y - \hat{y}) + \Delta,$$

$$\dot{\Delta} = L_2(y - \hat{y}),$$

$$\hat{y} = U_{OCV}(\hat{x}_1) - \Delta y_1,$$

wherein "$\Delta y_1$" is the measured voltage change between the charging period 182 and the rest period 184, "L" is the gain of the reduced observer, and "$C_{nom,E}$" is an estimated $C_{nom}$.

For L>0 and $L_2$>0, the SOC estimate $\hat{x}$ converges to the actual SOC $x_1$ asymptotically, irrespective of the initial value used for $C_{nom,E}$ or the value of the offset δu.

Next, a second charge period 186 is conducted using a second charging current $u_{1-2}$ which has the same value as the first charging current $u_{1-1}$. The charging current during the first and second charging period is thus referred to as a first leg charging current $u_1$, wherein the first leg includes the first charging period 182, the rest period 184, and the second charging period 186. During the second charging period 186, the reduced observer 164 determines SOC based on the following parametric form:

$$z = \varphi\theta + \mathcal{D}\,(U_{OCV}(x_1(0)), t)$$

wherein $\mathcal{D}: \mathbb{R} \times \mathbb{R}^+ \to \mathbb{R}$ is a class $\mathcal{KL}$ function.

In the equation for the parametric form of "$z$", the last term accounts for effects resulting from an unknown state of charge. For an asymptotically stable filter design (Λ), however, the last two terms in the equation for the parametric form of "$z$" vanish asymptotically. Accordingly, by defining $\hat{\theta}(t)$ to be an estimate of the parameters, the parameter estimator law for the $C_{nom}$ estimator is given by:

$$\dot{\hat{\theta}}(t) = p(t)\varepsilon(t)\left(\frac{u_1\mathcal{L}\{U'_{OCV}(\hat{x}_1)\}}{\Lambda}\right)$$

$$\varepsilon(t) = \left(\frac{sy(t)}{\Lambda} - \hat{\theta}\frac{u_1\mathcal{L}\{U'_{OCV}(\hat{x}_1)\}}{\Lambda}\right)$$

$$\dot{p}(t) = \beta P(t) - \left(\frac{u_1\mathcal{L}\{U'_{OCV}(\hat{x}_1)\}}{\Lambda}\right)^2 p^2(t)$$

wherein $$\dot{\hat{\theta}}(t) = p(t)\varepsilon(t)\left(\frac{u_1\mathcal{L}\{U'_{OCV}(\hat{x}_1)\}}{\Lambda}\right)$$

$$\varepsilon(t) = \left(\frac{sy(t)}{\Lambda} - \hat{\theta}\frac{u_1\mathcal{L}\{U'_{OCV}(\hat{x}_1)\}}{\Lambda}\right)$$

$$\dot{p}(t) = \beta P(t) - \left(\frac{u_1\mathcal{L}\{U'_{OCV}(\hat{x}_1)\}}{\Lambda}\right)^2 p^2(t)$$

is the nominal capacity ($C_{nom}$), and the term "p(t)" is initialized as a positive number.

If desired, all of the above equations for the reduced estimator 164 may be run throughout the second charging period 186. At the end of the second charging period, a first $C_{nom}$ estimate ($C_{nom,1}$) is stored based upon the first leg charging current $u_1$.

Next, a second leg is executed beginning with application of a third charge current ($u_{2-1}$) to the cell 102 during a third charging period 188. The third charge current $u_{2-1}$ is applied for a length of time which is sufficient to allow any dynamics resulting from the capacitance of $C_1$ 158 to settle. A voltage reading is then obtained. The voltage value may be obtained using the voltage meter 138.

Once the voltage at the third charge current $u_{2-1}$ is obtained, the charging current is removed for a rest period 190. Once the system has settled, the voltage is again obtained. The difference between the voltage during application of the current $u_{2-1}$ and the voltage ($U_{ocv}$) during the rest period 190 is due to the applied current $u_{2-1}$ plus whatever unknown constant offset δu is present in the current detector 140. The over-potential loss compared to the $U_{ocv}$ is represented by the following equation:

$$\Delta y_2 = R_{eff}(u_{2-1} + \delta u)$$

Once the $\Delta y_2$ has been obtained, the following equations are run:

$$\dot{\hat{x}}_1 = -\frac{u_{2-1}}{C_{nom,E}} + L(y - \hat{y}) + \Delta,$$

$$\dot{\Delta} = L_2(y - \hat{y}),$$

$$\hat{y} = U_{OCV}(\hat{x}_1) - \Delta y_2.$$

For L>0 and $L_2$>0, the SOC estimate $\hat{x}$ again converges to the actual SOC $x_1$ asymptotically, irrespective of the initial value used for $C_{nom,E}$.

Next, a fourth charge period 192 is conducted using a fourth charging current $u_{2-2}$ which has the same value as the first charging current $u_{2-1}$. The charging current during the third and fourth charging period is thus referred to as a second leg charging current $u_2$, wherein the second leg includes the third charging period 188, the rest period 190, and the fourth charging period 192. The second leg charging current $u_2$ may be any desired value, so long as it is different from the value of the first leg charging current $u_1$. During the fourth charging period 192, the reduced observer 164 determines SOC based on the same parametric form identified above:

$$\dot{z} = \varphi\theta + \mathcal{D}\left(U_{OCV}(x_1(0)), t\right)$$

Accordingly, using the same parameter estimator law discussed above with the values applicable to the second charging leg provides a $C_{nom,2}$ based upon the second leg charging current $u_2$ which can be stored in the memory 104.

Once the above algorithms are run for both legs, the SOC is known and two estimated values for $C_{nom}$ are available, $C_{nom,1}$ and $C_{nom,2}$. The errors introduced by the unknown offset can then be eliminated by calculating the true nominal capacity using the following equation:

$$\hat{C}_{nom} = \frac{\hat{C}_{nom,1}\hat{C}_{nom,2}\left(1 - \frac{u_1}{u_2}\right)}{\hat{C}_{nom,1} - \hat{C}_{nom,2}\frac{u_1}{u_2}}$$

The calculated $C_{nom}$ may then be used in the parameter estimator 162 and the reduced modified observer. Additionally, the constant offset can be estimated using the following equation:

$$\delta u = \frac{1}{2}\left(u_1\left(\frac{\hat{C}_{nom}}{\hat{C}_{nom,1}} - 1\right) + u_2\left(\frac{\hat{C}_{nom}}{\hat{C}_{nom,2}} - 1\right)\right)$$

The constant offset can be used correct readings obtained from the amp meter 104.

Figure 5:
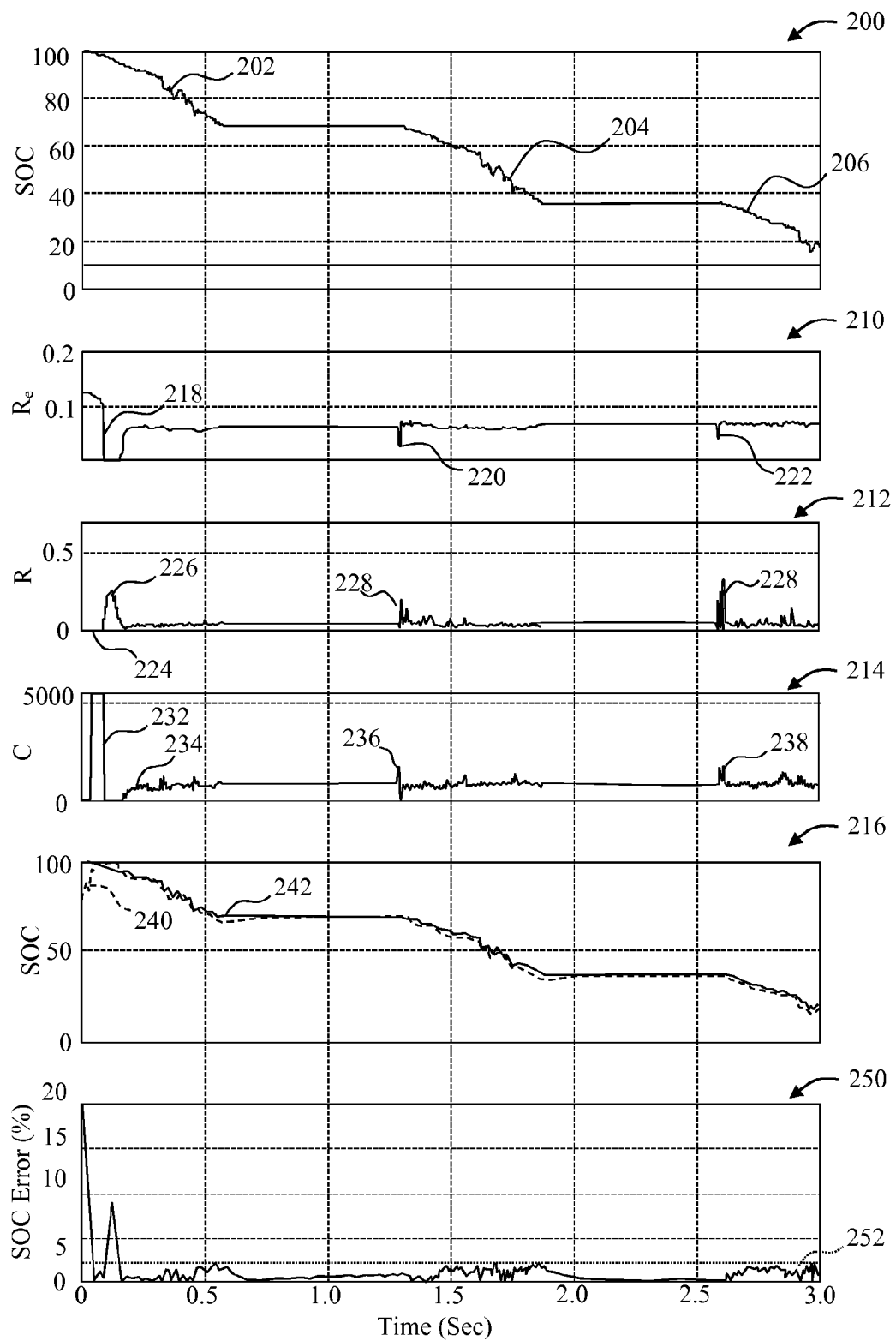
FIG. 5 depicts the results of a validation process in which a lithium-ion cell is discharged and the model of FIG. 3 is used to generate kinetic parameters and SOC.

The model 160 was validated using a commercial 18650 Li-ion cell while estimating all parameters in real time. Actual values for $U_{ocv}$ and nominal capacity $C_{nom}$ were obtained using open cell voltage experiments prior to validation testing. During validation testing, three consecutive drive cycles were applied to the cell with intermediate rests. The results are shown in FIG. 5 which includes a chart 200 of the actual SOC of the cell versus time. The three drive cycles resulted in voltage drop regions 202, 204, and 206 resulting in an ending SOC of 20%. The cell voltages corresponding to 100% and 0% SOC were 4.1V and 2.8V, respectively.

In running the model 160, a noise of 20 mV was introduced into the voltage signal. A noise of C/50 A and an additional error in the form of an offset of C/10 A was introduced on the current signal. Additionally, the initial value for each of the kinetic parameters was established at between 2 and 10 times the actual value with an initial error of 20% for the SOC. The values for the kinetic parameters and the SOC generated by the model 160 during the validation testing are shown in FIG. 5 by charts 210, 212, 214, and 216.

Chart 210 depicts the estimated value generated by the parameter estimator 162 for the $R_e$. The estimated $R_e$ initially exhibits a large drop at 218 during the initial voltage drop region 202 primarily because of the introduced 20% error in the initial SOC estimate. The estimated $R_e$ quickly stabilizes thereafter for the remainder of the voltage drop region 202. At the initialization of the voltage drop regions 204 and 206, smaller perturbations at 220 and 222 are exhibited because of changing current, temperature, and SOC values. The estimated value of $R_e$ is otherwise stable in the voltage drop regions 204 and 206.

Chart 212 depicts the estimated value generated by the parameter estimator 162 for the resistor ($R_1$) 156. The estimated $R_1$ is initially zero at 224 as the estimated $R_e$ drops at 218 because of the large initial SOC error. As the estimated $R_e$ begins to increase during the initial voltage drop region 202, the estimated $R_1$ increases at 226 and then settles to a stable value for the remainder of the voltage drop region 202. At the initialization of the voltage drop regions 204 and 206, smaller perturbations at 228 and 230 are exhibited because of changing current, temperature, and SOC values. The estimated value of $R_1$ is otherwise stable in the voltage drop regions 204 and 206.

Chart 214 depicts the estimated value generated by the parameter estimator 162 for the capacitor ($C_1$) 158. The estimated $C_1$ initially exhibits a large perturbation at 232. As the other estimated parameters and SOC stabilize during the initial voltage drop region 202, the estimated $C_1$ stabilizes at 234 for the remainder of the voltage drop region 202. At the initialization of the voltage drop regions 204 and 206, smaller perturbations at 236 and 238 are exhibited because of changing current, temperature, and SOC values. The estimated value of $C_1$ is otherwise stable in the voltage drop regions 204 and 206.

Chart 216 depicts the estimated SOC value 240 generated by the reduced modified observer 164 along with the estimated SOC 242 based upon coulomb counting. The estimated SOH, initialized with a 20% error, rapidly converges to the SOC 242. The actual SOC error of the estimated SOC value 240 is depicted in chart 250. Chart 250 reveals the actual SOC error decreases to less than 2% (line 252). The variation in the SOC error during the rest periods of chart 200 result from changing temperature of the cell.

The model 160 was also validated with respect to the ability to estimate $C_{nom}$. To this end, a charging profile like the profile 180 of FIG. 4 was simulated. In running the model 160, a noise of 20 mV was introduced into the voltage signal. A noise of C/50 A and an additional error in the form of an offset of C/10 A was introduced on the current signal. Additionally, the initial value for each of the kinetic parameters was established at between 2 and 10 times the actual value with an initial error of 20% for the SOC.

Figure 6:
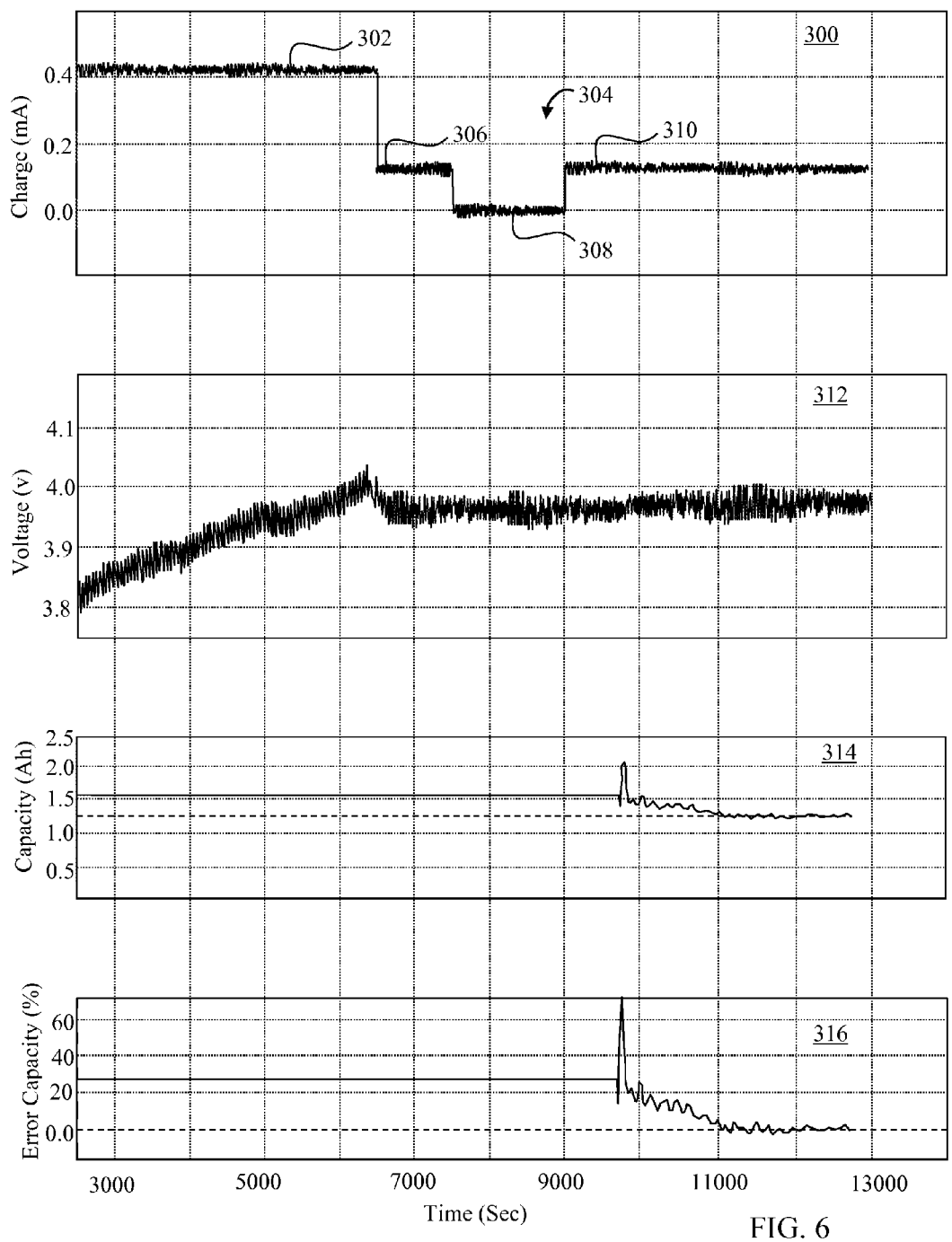
FIG. 6 depicts the results of a validation process in which a simulated charging of a lithium-ion cell similar to the charging sequence of FIG. 4 is used to estimate a cell nominal capacity.

The results of the $C_{nom}$ estimation simulation are shown in FIG. 6 which includes a chart 300 depicting a charging portion 302 of a first charging leg along with a second charging leg 304 including an initial charging period 306, a rest period 308, and a final charging period 310. The voltage of the cell during the charging cycle is depicted in chart 312.

The estimated $C_{nom}$ for the cell which was generated by the model 160 is depicted in chart 314. As discussed above, the $C_{nom}$ estimate requires a $C_{nom,1}$ from the first charging leg as well as a $C_{nom,2}$ from the second charging leg in order to provide a $C_{nom}$ estimate. Accordingly, prior to T=9000, at which point the final charging period 310 commences, there is no capacity estimate available from the reduced observer 164. Once a $C_{nom,2}$ is available from the second charging leg 304, an initial estimate of capacity is made at about T=9600.

The error between the estimated capacity depicted in chart 316 is depicted in chart 316. As evidenced by the chart 316, even though the initial capacity estimate was established with an error of about 30%, the reduced observer 164 converges to an accurate $C_{nom}$ estimate by T=11000. Thus, even in a noisy environment with large initial errors, the reduced observer 164 provides an accurate estimate of $C_{nom}$.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. An electrochemical battery system, comprising:
   at least one electrochemical cell;
   a first sensor configured to generate a current signal indicative of an amplitude of a current passing into or out of the at least one electrochemical cell;
   a second sensor configured to generate a voltage signal indicative of a voltage across the at least one electrochemical cell;
   a memory in which command instructions and a reduced observer model configured to generate estimates of state of charge (SoC) of the at least one electrochemical cell are stored; and
   a processor configured to execute the command instructions to obtain the current signal and the voltage signal, and to generate an estimated cell nominal capacity ($C_{nom}$) of the at least one electrochemical cell by monitoring the at least one electrochemical cell during a first charging sequence comprising:
      applying a first charging current to the at least one electrochemical cell for a first predetermined time period;
      ceasing the first charging current for a first predetermined rest period following the first predetermined time period during which no charging current is applied to the at least one electrochemical cell;
      measuring a first open circuit voltage level of the at least one electrochemical cell during the first predetermined rest period using the second sensor;
      applying the first charging current at the first current level to the at least one electrochemical cell for a second predetermined time period following the first rest period;
      measuring a first charging voltage level of the at least one electrochemical cell during at least one of the first predetermined time period and the second predetermined time period; and
      measuring a first current level (u1) of the first charging current using the first sensor during at least one of the first predetermined time period and the second predetermined time period;
   generating an estimated first leg $C_{nom1}$ of the at least one electrochemical cell during the first charging sequence based on:
      a first estimated SoC for the at least one electrochemical cell during the first charging sequence and the first current level (u1), the processor generating the first estimated SoC using the reduced observer model stored in the memory applied to a predetermined initial estimate of the state of charge $C_{nom,E}$, the first current level (u1), and a difference between the first open circuit voltage level and the first charging voltage level, the first estimated state of charge $C_{nom1}$ including a first error produced by a current measurement offset ($\delta u$) of the first sensor;
   monitoring the at least one electrochemical cell during a second charging sequence comprising:
      applying a second charging current to the at least one electrochemical cell for a third predetermined time period, the second charging current being different than the first charging current;
      ceasing the second charging current for a second predetermined rest period following the third predetermined time period during which no charging current is applied to the at least one electrochemical cell;
      measuring a second open circuit voltage level of the at least one electrochemical cell during the second predetermined rest period using the second sensor;
      applying the second charging current at the second current level for a fourth predetermined time period following the second rest period;
      measuring a second charging voltage level of the at least one electrochemical cell during at least one of the third predetermined time period and the fourth predetermined time period; and
      measuring a second current level (u2) of the second charging current using the first sensor during at least one of the third predetermined time period and the fourth predetermined time period;
   generating an estimated second leg $C_{nom2}$ of the at least one electrochemical cell during the second charging sequence based on:
      a second estimated SoC for the at least one electrochemical cell during the second charging sequence and the second current level (u2), the processor generating the second estimated SoC using the reduced observer model stored in the memory applied to the predetermined initial estimate of the state of charge $C_{nom,E}$, the second current level u2, and a difference between the second open circuit voltage level and the second charging voltage level, the second estimated state of charge $C_{nom2}$ including a second error produced by the current measurement offset ($\delta u$) of the first sensor;
   and
   generating, with the processor, the estimated cell nominal capacity $C_{nom}$ based upon the estimated first leg $C_{nom1}$, the estimated second leg $C_{nom2}$, the first current level (u1), and the second current level (u2), the estimated cell nominal capacity $C_{nom}$ not including an error produced by the current measurement offset ($\delta u$) of the first sensor.

2. The system of claim 1 wherein the processor is further configured to:
   generate the estimated cell nominal capacity $C_{nom}$ based on a product of the estimated first leg $C_{Cnom1}$, the estimated second leg $C_{nom2}$, and a quotient of the first current divided by the second current subtracted from one (1), the product being divided by the estimated second leg $C_{nom2}$ multiplied by the quotient of the first current divided by the second current and subtracted from the estimated first leg $C_{nom1}$.

3. The system of claim 2, wherein the processor is further configured to execute the command instructions to estimate the current measurement offset ($\delta u$) of the first sensor as one half of a sum of the first current multiplied by one (1)

subtracted from a quotient of the estimated nominal cell capacity $C_{nom}$ divided by the estimated first leg $C_{nom1}$ with the second current multiplied by one (1) subtracted from a quotient of the estimated nominal cell capacity $C_{nom}$ divided by the estimated second leg $C_{nom2}$ to reduce or eliminate an error in current measurements from the first sensor due to the current measurement offset ($\delta u$).

4. A method of generating an estimated cell nominal capacity ($C_{nom}$) of at least one electrochemical cell in a system comprising:
monitoring, with a processor, a first sensor that measures current in the at least one electrochemical cell, and a second sensor that measures voltage in the at least one electrochemical cell, the at least one electrochemical cell during a first charging sequence comprising:
applying a first charging current to the at least one electrochemical cell for a first predetermined time period;
ceasing the first charging current for a first predetermined rest period following the first predetermined time period during which no charging current is applied to the at least one electrochemical cell;
measuring a first open circuit voltage level of the at least one electrochemical cell during the first predetermined rest period using the second sensor;
applying the first charging current at the first current level to the at least one electrochemical cell for a second predetermined time period following the first rest period;
measuring a first charging voltage level of the at least one electrochemical cell during at least one of the first predetermined time period and the second predetermined time period; and
measuring a first current level (u1) of the first charging current using the first sensor during at least one of the first predetermined time period and the second predetermined time period;
generating, with the processor an estimated first leg $C_{nom1}$ of the at least one electrochemical cell during the first charging sequence based on:
a first estimated state of charge (SoC) for the at least one electrochemical cell during the first charging sequence and the first current level (u1), the processor generating the first estimated SoC using a reduced observer model stored in a memory applied to a predetermined initial estimate of the state of Charge $C_{nom, E}$, the first current level (u1), and a difference between the first open circuit voltage level and the first charging voltage level, the first estimated state of charge $C_{nom1}$ including a first error produced by a current measurement offset ($\delta u$) of the first sensor;
monitoring, with the processor, the first sensor, and the second sensor the at least one electrochemical cell during a second charging sequence comprising:
applying a second charging current to the at least one electrochemical cell for a third predetermined time period, the second charging current being different than the first charging current;
ceasing the second charging current for a second predetermined rest period following the third predetermined time period during which no charging current is applied to the at least one electrochemical cell;
measuring a second open circuit voltage level of the at least one electrochemical cell during the second predetermined rest period using the second sensor;
applying the second charging current at the second current level for a fourth predetermined time period following the second rest period;
measuring a second charging voltage level of the at least one electrochemical cell during at least one of the third predetermined time period and the fourth predetermined time period; and
measuring a second current level (u2) of the second charging current using the first sensor during at least one of the third predetermined time period and the fourth predetermined time period;
generating an estimated second leg $C_{nom2}$ of the at least one electrochemical cell during the second charging sequence based on:
a second estimated SoC for the at least one electrochemical cell during the second charging sequence and the second current level (u2), the processor generating the second estimated SoC using the reduced observer model stored in the memory applied to the predetermined initial estimate of the state of Charge $C_{nom, E}$, the second current level u2, and a difference between the second open circuit voltage level and the second charging voltage level, the second estimated state of charge $C_{nom2}$ including a second error produced by the current measurement offset ($\delta u$) of the first sensor; and
generating, with the processor, the estimated cell nominal capacity $C_{nom}$ based upon the estimated first leg $C_{nom1}$, the estimated second leg $C_{nom2}$, the first current level (u1), and the second current level (u2), the estimated cell nominal capacity $C_{nom}$ not including an error produced by the current measurement offset ($\delta u$) of the first sensor.

5. The method of claim 4, further comprising:
generating, with the processor, the estimated cell nominal capacity $C_{nom}$ based on a product of the estimated first leg $C_{nom1}$, the estimated second leg $C_{nom2}$, and a quotient of the first current divided by the second current subtracted from one (1), the product being divided by the estimated second leg $C_{nom2}$ multiplied by the quotient of the first current divided by the second current and subtracted from the estimated first leg $C_{nom1}$.

6. The method of claim 4, further comprising:
estimating, with the processor, the current measurement offset ($\delta u$) of the first sensor as one half of a sum of the first current multiplied by one (1) subtracted from a quotient of the estimated nominal cell capacity $C_{nom}$ divided by the estimated first leg $C_{nom1}$ with the second current multiplied by one (1) subtracted from a quotient of the estimated nominal cell capacity $C_{nom}$ divided by the estimated second leg $C_{nom2}$ to reduce or eliminate an error in current measurements from the first sensor due to the current measurement offset ($\delta u$).

* * * * *